US006528722B2

(12) United States Patent
Huang et al.

(10) Patent No.: US 6,528,722 B2
(45) Date of Patent: *Mar. 4, 2003

(54) BALL GRID ARRAY SEMICONDUCTOR PACKAGE WITH EXPOSED BASE LAYER

(75) Inventors: Chien Ping Huang, Hsinchu Hsien (TW); Randy H. Y. Lo, Taichung Hsien (TW)

(73) Assignee: Siliconware Precision Industries Co., Ltd. (TW)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/235,095

(22) Filed: Jan. 21, 1999

(65) Prior Publication Data

US 2002/0046854 A1 Apr. 25, 2002

(30) Foreign Application Priority Data

Jul. 31, 1998 (TW) .......................................... 87112600 A

(51) Int. Cl.$^7$ ............................. H01L 23/28; H05K 5/06
(52) U.S. Cl. ..................... 174/52.2; 174/52.4; 257/676; 257/686; 257/737; 257/787
(58) Field of Search ................................. 257/686, 778, 257/676, 777, 779, 780, 737, 738, 787; 174/52.4, 52.2

(56) References Cited

U.S. PATENT DOCUMENTS

| 5,608,265 | A | * | 3/1997 | Kitano et al. ................ 257/738 |
| 5,763,939 | A | * | 6/1998 | Yamashita .................... 257/668 |
| 5,952,611 | A | * | 9/1999 | Eng et al. .................... 174/52.4 |
| 5,999,413 | A | * | 12/1999 | Ohuchi et al. ............... 361/772 |
| 6,020,637 | A | * | 2/2000 | Karnezos ..................... 257/783 |
| 6,072,233 | A | * | 6/2000 | Corisis et al. ............... 257/686 |
| 6,144,102 | A | * | 11/2000 | Amagai ....................... 257/781 |
| 6,150,730 | A | * | 11/2000 | Chung et al. ................ 257/786 |
| 6,326,700 | B1 | * | 12/2001 | Bai et al. .................... 257/790 |
| 6,462,274 | B1 | * | 10/2002 | Shim et al. ................ 174/52.4 |

* cited by examiner

Primary Examiner—Hung V. Ngo
(74) Attorney, Agent, or Firm—Sawyer Law Group LLP

(57) ABSTRACT

A Ball Grid Array (BGA) semiconductor package with exposed base layer includes a base layer having an opening portion in the center thereof and formed with a plurality of holes about the opening portion. A plurality of leads are attached to a second surface of the base layer and each of the leads is connected to a corresponding hole in the base layer. A semiconductor chip is attached and electrically connected to the leads. The semiconductor chip and the leads are covered by an encapsulant formed by an encapsulating compound, leaving a first surface of the base layer exposed. A plurality of solder balls are planted in the holes in the base layer, which are electrically bonded to the leads so as to electrically connect the semiconductor chip to external devices. In this BGA semiconductor package, the leads together with the base layer are used as a substrate for the semiconductor chip to attach thereto. Therefore, there is no need of costly BGA substrate.

2 Claims, 5 Drawing Sheets

BALL GRID ARRAY SEMICONDUCTOR PACKAGE WITH EXPOSED BASE LAYER

BACKGROUND OF THE INVENTION

1. Field of the Invention

This invention relates to semiconductor packages, and more particularly, to a Ball Grid Array (BGA) semiconductor package having a semiconductor chip with center bond pads.

2. Description of Related Art

A conventional semiconductor package is illustrated in FIG. 11, as designated by the reference numeral 1. As shown, this semiconductor package 1 includes a lead frame 11 on which a semiconductor chip 12 is mounted by means of a double-sided adhesive tape 110 which is adhered on the leads 111 of the lead frame 11. The chip 12 is electrically connected to the inner leads 111a of the leads 111 via gold wires 13. Further, an encapsulant 14 is formed through a molding process to hermetically enclose the chip 12, the gold wires 13, and the inner leads 111a of the leads 111 therein. In use, the semiconductor package 1 is mounted on a circuit board.

The outer leads 111b of the leads 111 are first horizontally outwardly extended and then downwardly bent. The ends of the outer leads 111b thus are spaced at intervals greater than the distance between the opposite sides of the encapsulant 14. As a result, the printed circuit board (PCB) area taken up by the semiconductor package 1 includes an apron area, which extend around the perimeter of the semiconductor package 1. When several semiconductor packages of this type are mounted onto a printed circuit board, the collective apron areas thereof take up a significant amount of PCB space, and prevent a close spacing between the packages. Therefore, the size of a printed circuit board is unable to be minimized.

A solution to the foregoing problem is the so-called Ball Grid Array (BGA) technology. A conventional BGA semiconductor package 2 is illustrated in FIG. 12. As shown, the BGA semiconductor package 2 comprises a substrate 21 having first conductive traces 212 formed on an upper surface 211 thereof. The fist conductive traces 212 are electrically connected to second conductive traces 215 formed on a lower surface 214 of the substrate 21 through vias or plated through-holes 213. The second conductive traces 215 each terminate with a contact pad 216 where a conductive solder ball 25 is attached. The chip 22 can thus be electrically connected to a printed circuit board via the solder balls 25, which are arranged in an array pattern. A chip 22 is attached to the upper surface 211 of the substrate 21 on which a plurality of bonding pads 23 are formed. Each of the bonding pad 23 is electrically connected to the fist conductive traces 212 by means of gold wires 24. The chip 22, gold wires 24 and the first conductive traces 212 are then covered by an encapsulant 26.

In the forgoing BGA semiconductor package 2 shown in FIG. 12, the use of the solder balls 25 for I/O connections would save more layout space on the circuit board than the semiconductor package 1 shown in FIG. 11. This is because the solder balls 25 are provided on the lower surface 214 of the substrate 21 without having an apron area resulting from the outwardly extending outer leads 111b as in the case of the semiconductor package 1 shown in FIG. 11. This arrangement allows the area occupied by the BGA semiconductor package 2 on the circuit board to be substantial equal to the package size, thus saving more layout space on the circuit board. The circuit board can thus be made more compact in size.

One drawback to the foregoing BGA semiconductor package 2 shown in FIG. 12, however, is that the gold wires 24 bonded radially from the periphery of the chip 22 to the first conductive traces 212 would cause the projection area of the encapsulant 26 to be considerably larger than that of the chip 22, thus making the size of the resulted package still unsatisfactorily large in size. Moreover, the BGA semiconductor package 2 is quite costly to manufacture since the substrate 21 is quite expensive. The use of the BGA semiconductor package 2 is therefore still unsatisfactory.

A solution to downsize the BGA semiconductor package is the so-called Chip Scale Package (CSP) technique. A conventional CSP semiconductor package 3 is illustrated in FIG. 13. As shown, this CSP semiconductor package 3 is characterized by the fact that the projection area of the substrate 31 is only slightly larger than that of the chip 32, which allows the resulted package to be very compact in size.

One drawback to the foregoing CSP semiconductor package 3, however, is that it requires the use of a BGA substrate as well as advanced flip-chip and solder bumping techniques to assemble and is therefore very costly to manufacture. For this reason, it is only suitable for high-end IC products and unsuited for low-end ones.

A cost-effective solution to the foregoing problem is disclosed in U.S. Pat. No. 5,663,594. The semiconductor package of this patent is schematically illustrated in FIG. 14, as designated by the reference numeral 4. As shown, this semiconductor package 4 includes a chip 42 mounted on the inner ends of the leads 412 of the lead frame 41. A plurality of gold wires 43 are used to electrically connect the chip 42 to the leads 412. An encapsulant 44 is formed to hermetically enclose the chip 42, the gold wires 43, and the loads 412 therein. Further, the encapsulant 44 is formed with a plurality of holes connected to the lower surface of the leads 412. Solder balls 45 can then be adhered to the lower surface of the leads 412 through the holes of the encapsulant 44, such that the resultant package can be electrically connected to a circuit board.

The foregoing semiconductor package 4 is very compact in size and can be manufactured by using existing packaging equipment and process. One drawback to it, however, is that it is only suitable for package chips of the type having peripheral bond pads but unsuitable for pack chips of the type having center bond pads. To appropriately cover leads 412 in the encapsulant 44, the thickness from the lower surface of the leads 412 to the bottom side of the encapsulant 44 should be spacious enough; otherwise, the encapsulant 44 would easily crack when curing. This requirement, however, would make the resultant package 4 disadvantageous in thickness. Moreover, since the holes that are formed in the encapsulant 44 and connected to the lower surface of the leads 412, are very small in diameter, the encapsulating resin used to form the encapsulant 44 would flash to the bottom of these holes, causing the subsequently arranged solder balls 45 to be leasely soldered to the lower surface of the leads 412. The yield rate of the resultant product is thus low. One solution to this problem is to perform a hole-cleaning process right after the holes are completely formed. This solution, however, would make the overall packaging process more complex and costly to implement.

SUMMARY OF THE INVENTION

It is therefore an objective of the present invention to provide a BGA semiconductor package with exposed base layer, which is simple in structure and cost-effective to manufacture.

It is another objective of the present invention to provide a BGA semiconductor package with exposed base layer, which is compact in size.

It is still another objective of the present invention to provide a BGA semiconductor package with exposed base layer, which can be manufactured by using known packaging equipment and process.

It is yet another objective of the present invention to provide a BGA semiconductor package with exposed base layer, which is suitable for packaging semiconductor chips of the type having center bond pads.

It is still yet another objective of the present invention to provide a BGA semiconductor package with exposed base layer, which uses a lead frame instead of a BGA substrate for a semiconductor chip to attach thereto.

In accordance with the foregoing and other objectives of the present invention, a BGA semiconductor package with exposed base layer is provided. The BGA semiconductor package of the invention includes the following constituent parts: (a) a base layer having an opening portion in the center thereof and formed with a plurality of holes about the opening portion, wherein the base layer has a first surface and a second opposed surface; (b) a lead frame having a plurality of leads, wherein each of the leads has a lower surface and an upper surface attached to the second surface of the base layer in a manner that inner end portions of the leads extend to the opening portion of the base layer and the upper surface of each of the leads is connected to the corresponding hole of the base layer, (c) a chip attached to the lower surface of the leads; (d) a plurality of bonding wires for electrically interconnecting the chip and the inner end portion of the leads; (e) an encapsulant encapsulating the chip, the bonding wires, and the leads, wherein the first surface of the base layer is exposed to the encapsulant, and (f) a plurally of solder balls electrically connected to the upper surface of the leads through the holes.

In another preferred embodiment, the BGA semiconductor package of the invention can be constructed in such a manner that the encapsulant is formed to encapsulate the semiconductor chip, the bonding wires and the leads, while leaving the first surface of the base layer and a bottom side of the semiconductor chip exposed to the encapsulant In still another preferred embodiment, the BGA semiconductor package of the invention can be constructed in such a manner that the encapsulant is formed encapsulate to the semiconductor chip, the bonding wires, and the leads, while leaving the first surface of the base layer and the lower surface of outer end portions of the leads exposed to tie encapsulant. This embodiment allows two or more units of the BGA semiconductor package of the invention to be stacked together for higher integration on the circuit board, by making the solder balls of a BGA semiconductor package in an upper position come into contact with the exposed portion of the lower surface of the leads of another BGA semiconductor package in a lower position.

Moreover, the base layer can be a non-conductive tape made of polyimide resin or a solder mask made of epoxy resin. In the case where a solder mask is used as the base layer, the solder mask is applied to the leads of the lead frame by means of coating.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

First Preferred Embodiment

Figure 1:
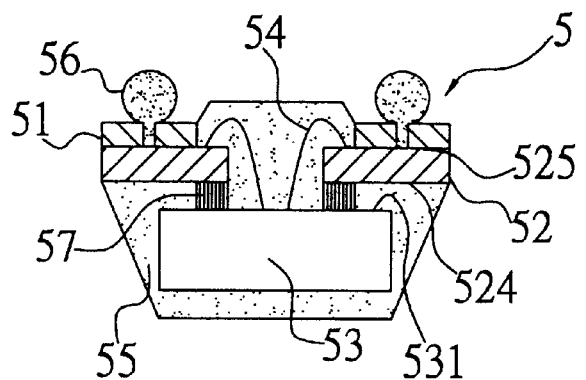
FIG. 1 is a schematic sectional diagram of a first preferred embodiment of the BGA semiconductor package of the invention.

A first preferred embodiment of the BGA semiconductor package according to the invention is disclosed in the following with reference to FIGS. 1 through 7, as designated by the reference numeral 5. As shown, the BGA semiconductor package 5 includes a non-conductive base layer 51, which can be a non-conductive tape made of polyimide or a solder mask; a plurality of leads 52 made of a copper alloy or an alloy of ferrite and nickel and adhered on the base layer 51; a semiconductor chip 53 attached to a lower surface 524 of the leads 52; a plurality of bonding wires, such as gold wires 54, for electrically connecting the semiconductor chip 53 to the leads 52; an encapsulant 55 for encapsulating the semiconductor chip 53, the gold wires 54, and the leads 52 therein; and a plurality of solder balls 56 planted in holes 511 formed and arranged in an array pattern in the base layer 51.

Figure 2:
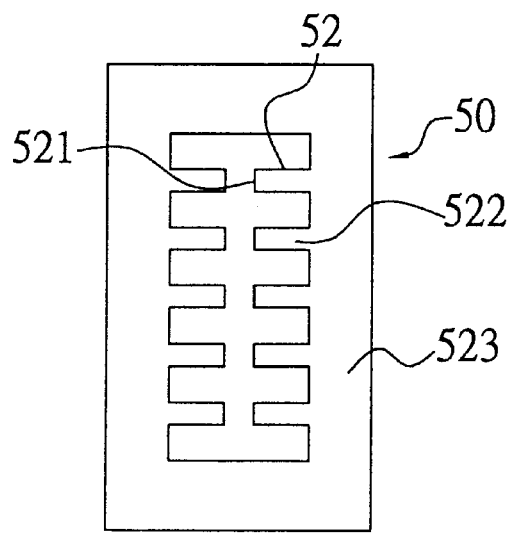
FIG. 2 is a schematic top view of a lead frame utilized in the BGA semiconductor package of FIG. 1.

As shown in FIGS. 1 and 2, the leads 52 each have an inner end portion 521 connected to the gold wire 54 and an outer end 522 connected to a skirt strip 523 to form a lead frame 50. Each of the leads 52 has a lower surface 524 and an upper surface 525.

Figure 3:
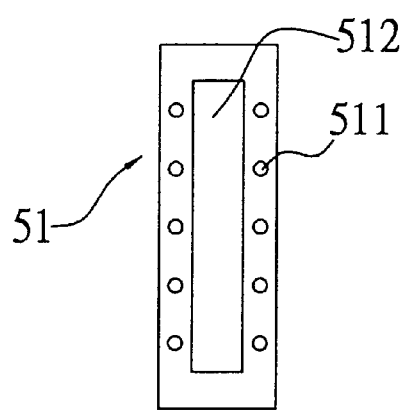
FIG. 3 is a schematic top view of a base layer utilized in the BGA semiconductor package of FIG. 1.
Figure 4:
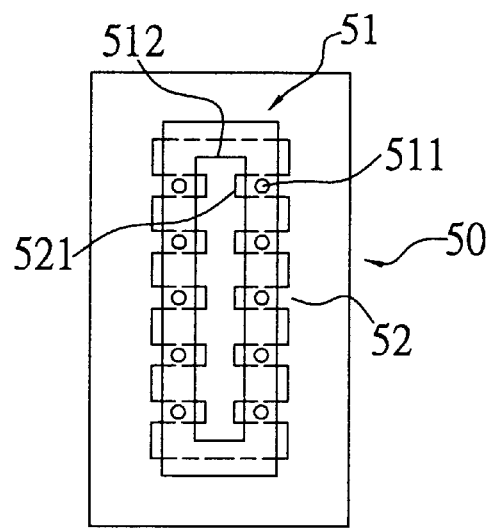
FIG. 4 is a schematic top view of the BGA semiconductor package of the first preferred embodiment when assembled.
Figure 6:
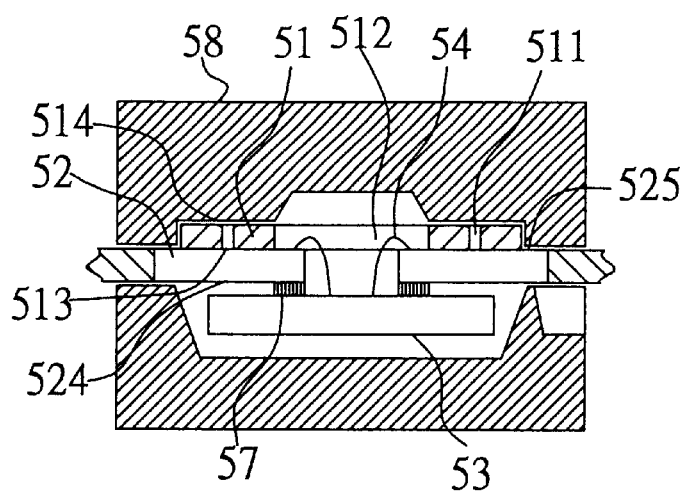
FIG. 6 shows the assembly of FIG. 5 being encapsulated in an encapsulant.

As shown in FIGS. 1 and 3, the base layer 51 is a tape made of a non-conductive and heat-resistant material such as polyimide resin, and is formed with an opening portion 512 while the holes 511 are arranged along both sides of the opening portion 512 at equal intervals. As shown in FIGS. 4 and 6, the base layer 51 has a first surface 513 and a second surface 514. Further, the base layer 51 can instead be formed by coating a layer of solder mask made of epoxy resin over the upper surface 525 of the leads 52. The holes 511 can also be formed in the solder mask layer and correspond to each of the heads 52.

Figure 7:
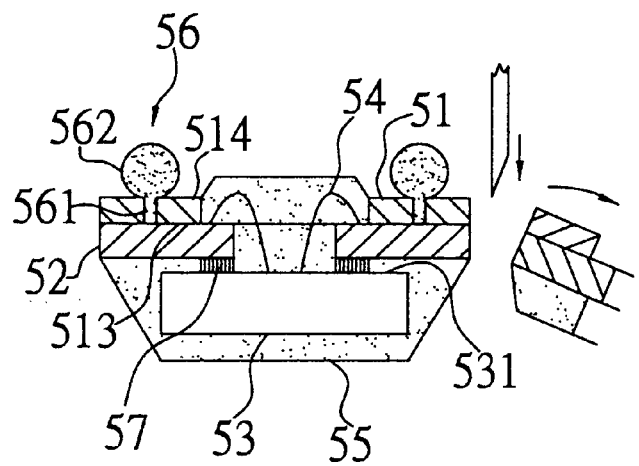
FIG. 7 shows the formation of the BGA semiconductor package of the first preferred embodiment.

As shown in FIG. 7, the solder balls 56 are each formed in such a manner as to have a root portion 561 penetrating the associated one of the holes 511 in the base layer 51 to the corresponding one of the leads 52 and an exposed portion 562 on the first surface 513 of the base layer 51.

Figure 5:
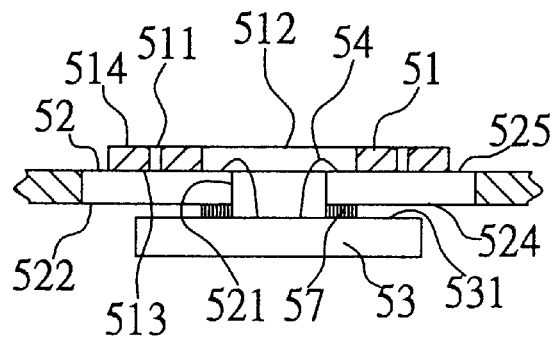
FIG. 5 is a schematic sectional diagram of the BGA semiconductor package of the first preferred embodiment when a chip is readily attached to the lead frame.

In the packaging process for the BGA semiconductor package 5, the first step is to adhere the second surface 514 of the base layer 51 onto the upper surface 525 of the leads 52 in such a manner that the inner end portions 521 of the leads 52 extend in the opening portion 512 of the base layer 51, and the holes 511 are correspondingly connected to the leads 52, as illustrated in FIG. 4. The lower surface 524 of each of the leads 52 is mounted with a double-sided adhesive tape 57 for attaching the chip 53 to the leads 52, as illustrated in FIG. 5. Alternatively, the chip 53 can be attached to the inner end portions 521 of the leads 52 with a conventional die attach adhesive such as non-conductive epoxy.

Next, gold wires 54 are provided to electrically connect the bonding pads (not shown) formed on a top side 531 of the chip 53 to the upper surface 525 of the inner end portion 521 of a corresponding lead 52. Further, as illustrated in FIGS. 6 and 7, a transfer molding process is performed to form the encapsulant 55 which covers the semiconductor chip 53, the gold wires 54, and part of the leads 52 therein. Through this process, however, the base layer 51 is kept to expose to the resultant BGA semiconductor package 5, i.e., the base layer 51 is not encapsulated by the encapsulant 55, so that the holes 511 can be kept clean. After this, the solder balls 56 are planted into the holes 511, allowing the leads 52 to be electrically connected to the solder balls 56. Since the holes 511 are clean, the solder balls 56 can be securely soldered to the holes 511. Next the leads 52 extending out of the encapsulant 55 and the skirt strip 523 are cut apart This completes the packaging process of the BGA semiconductor package 5. By the invention, the projection area of the encapsulant 55 is less than 1.2 times the area of the chip 53, which is a considerable improvement over the prior art.

The resultant BGA semiconductor package 5 is then mounted on a printed circuit board by soldering the solder balls 56 to the printed circuit board. Compared to the prior art, since the semiconductor BGA package of the invention needs no costly BGA substrate having conductive traces formed on both sides thereof and vias for electrically connecting the conductive traces, the invention can be manufactured by conventional lead frame and wire bonding method and is thus apparently easier and more cost-effective to manufacture than the prior art. Moreover, as the first surface 513 of the base layer 51 is not encapsulated by the encapsulant 55, the thus-obtained BGA semiconductor package can be of a thickness smaller than the prior art. Furthermore, by the invention, the encapsulating resin used to form the encapsulant 55 would not fill into the holes 511, thus making the holes 511 clean for the subsequent soldering of the solder balls 56, without having to perform a precleaning process on the holes 511 as in the case of the prior art. This benefit makes the BGA semiconductor package of the invention more cost-effective to manufacture.

Second Preferred Embodiment

Figure 8:
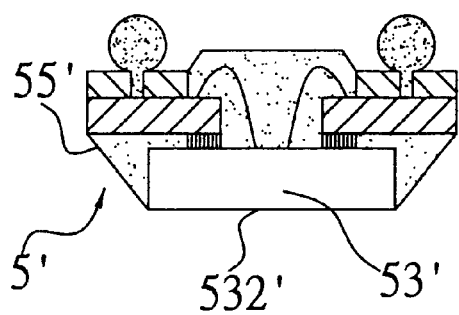
FIG. 8 is a schematic sectional diagram of a second preferred embodiment of the BGA semiconductor package of the invention.

A second preferred embodiment of the BGA semiconductor package according to the invention is disclosed in the following with reference to FIG. 8, as designated by the reference numeral 5'. The second preferred embodiment of the BGA semiconductor packages differs from the first preferred embodiment shown in FIGS. 1-7 only in that the encapsulant 55' here is formed in such a manner as to expose the bottom side 532' of the semiconductor chip 53' to the atmosphere. The heat generated by the semiconductor chip 53' thus can be directly dissipated to the atmosphere via the bottom side 532' of the semiconductor chip 53'. The heat-dissipating efficiency of the BGA semiconductor package 5' is accordingly improved.

Third Preferred Embodiment

Figure 9:
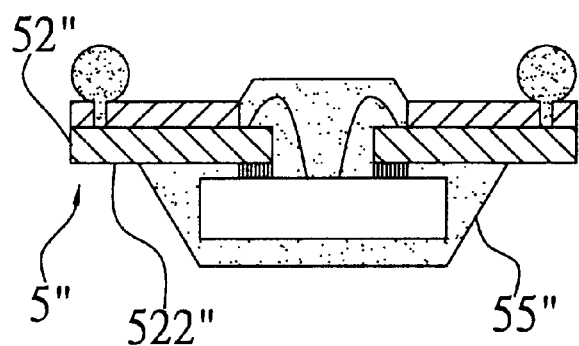
FIG. 9 is a schematic sectional diagram of a third preferred embodiment of the BGA semiconductor package of the invention.
Figure 10:
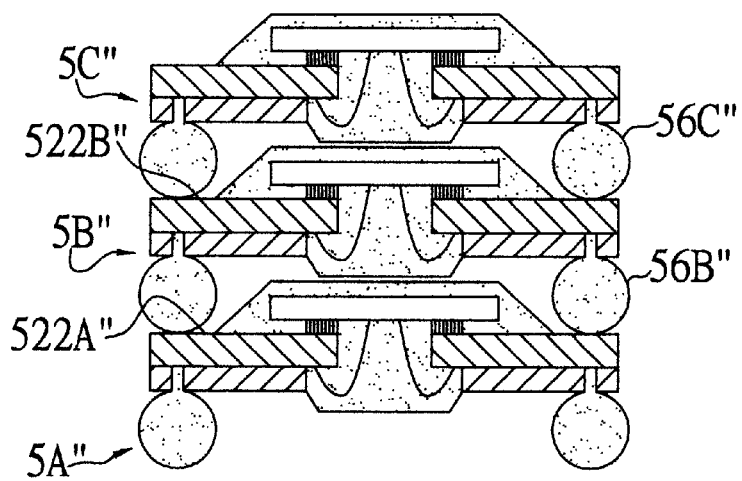
FIG. 10 shows the stacking of three units of the BGA semiconductor package shown in FIG. 9.
Figure 11:
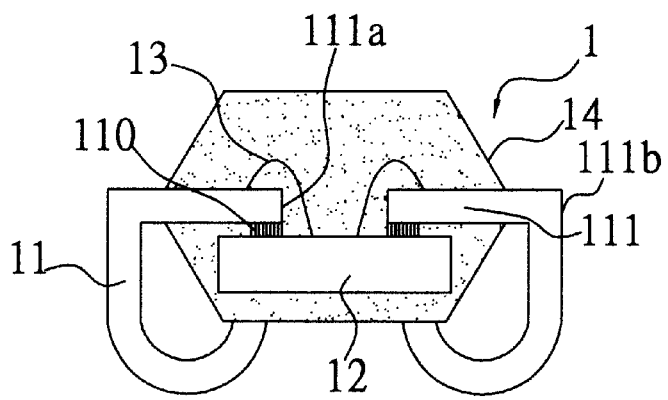
FIG. 11 is a schematic sectional diagram of a conventional lead-type semiconductor package.
Figure 12:
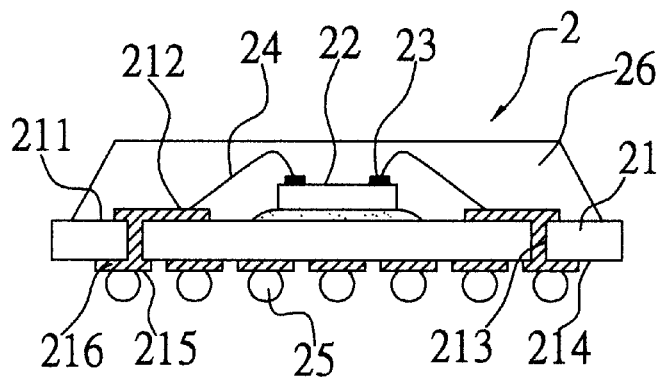
FIG. 12 is a schematic sectional diagram of a conventional BGA semiconductor package.
Figure 13:
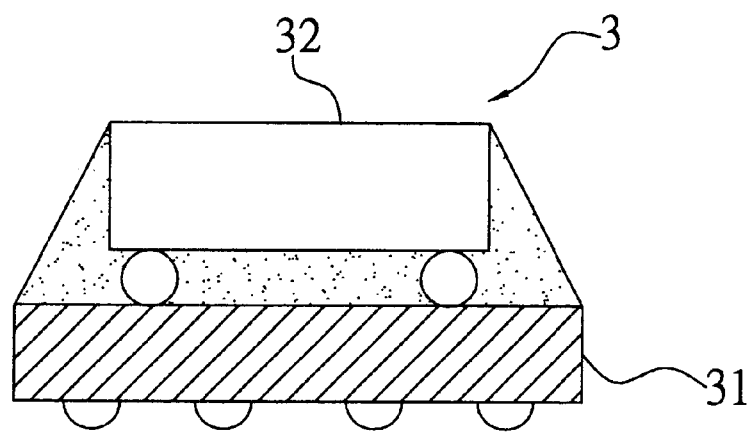
FIG. 13 is a schematic sectional diagram of a conventional BGA semiconductor package.
Figure 14:
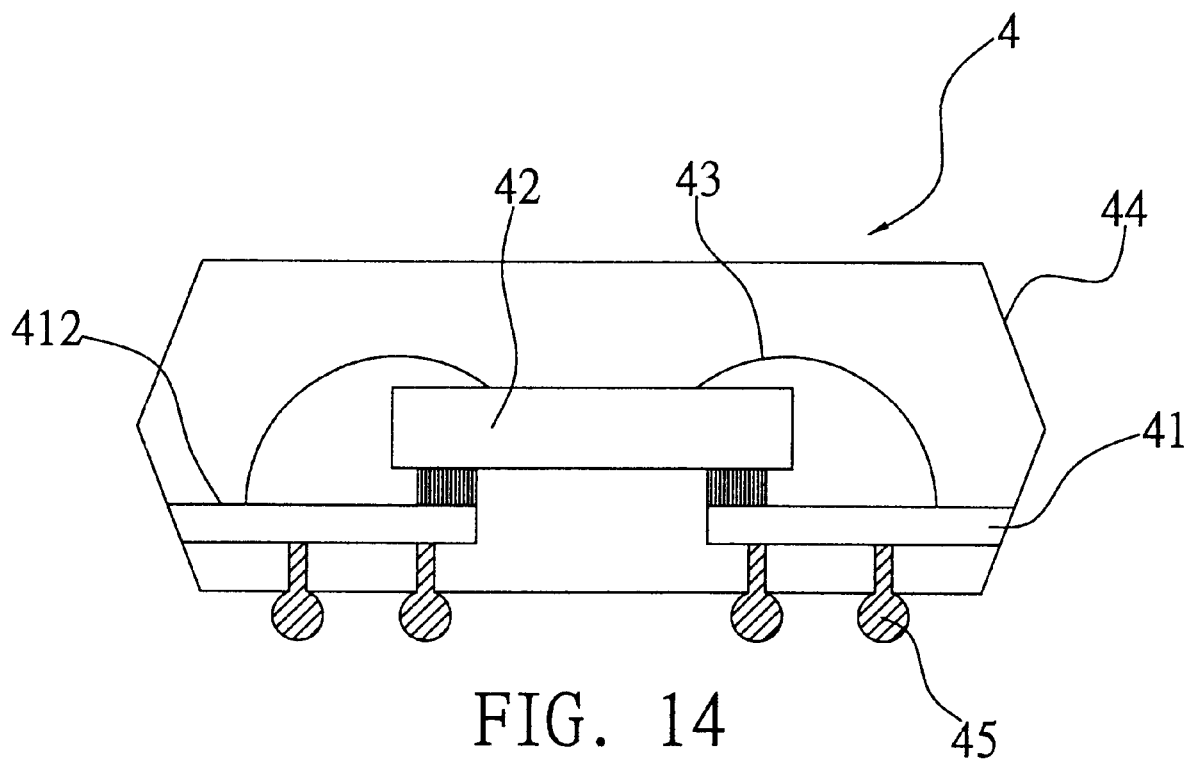
FIG. 14 is a schematic sectional diagram of a conventional BGA semiconductor package that utilizes a lead frame as the substrate.

A third preferred embodiment of the BGA semiconductor package according to the invention is disclosed in the following with reference to FIGS. 9-10, as designated by the reference numeral 5". The third preferred embodiment of the BGA semiconductor package 5" differs from the precious two embodiments only in that the encapsulant 55" is formed in such a manner as to expose the lower surface 524" of the outer end portion 522" of the leads 52" to the outside of the encapsulant 55". By exposing the lower surface 524" of the outer end portion 522", the BGA semiconductor package 5" is allowed to be stacked together, as illustrated in FIG. 10. As shown, three units of BGA semiconductor package 5" respectively designated by the reference numerals 5A", 5B", 5C" can be stacked together, with the solder balls 56B" of the second unit 5B"coming into contact with the exposed outer end portion 522A" of the first unit 5A", and the solder balls 56C" of the third unit 5C" coming into contact with the exposed outer end portion 522B" of the second unit 5B". This allows the integration of three units of BGA semiconductor package 5" on the same circuit board.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A BGA semiconductor package, which comprises:
    a base layer having an opening portion and formed with a plurality of holes about the opening portion, wherein the base layer has a first surface and a second opposed surface;
    a lead frame having a plurality of leads, wherein each of the leads has a lower surface and an upper opposed surface attached to the second surface of the base layer in a manner that, inner end portions of said leads extend to the opening portion of the base layer and the upper surface of each of the leads is connected to the corresponding hole in the base layer;
    a semiconductor chip attached to the lower surfaces of the leads;
    a plurality of bonding wires for electrically connecting the semiconductor chip and the inner end portions of the leads;
    an encapsulant for encapsulating the semiconductor chip, the bonding wires, and the leads, wherein the first surface of the base layer and a peripheral portion of the lower surface of each of the leads are exposed to the encapsulant; and
    a plurality of solder balls electrically connected to the upper surfaces of the leads through the holes in the base layer, in a manner that the solder balls are aligned in position with the exposed peripheral portions of the leads.

2. The BGA semiconductor package of claim 1, wherein a plurality of the semiconductor packages are capable of being vertically stacked in a manner that solder balls of a semiconductor package come into contact with exposed peripheral portions of leads of an adjacent semiconductor package.

* * * * *